(12) United States Patent
Ohkubo et al.

(10) Patent No.: US 7,432,170 B2
(45) Date of Patent: Oct. 7, 2008

(54) SEMICONDUCTOR DEVICE AND FABRICATION METHOD THEREOF

(75) Inventors: Hiroaki Ohkubo, Kanagawa (JP);
Ryota Yamamoto, Kanagawa (JP);
Masayuki Furumiya, Kanagawa (JP);
Masaharu Sato, Kanagawa (JP);
Kuniko Kikuta, Kanagawa (JP);
Makoto Nakayama, Kanagawa (JP);
Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 282 days.

(21) Appl. No.: 11/017,695

(22) Filed: Dec. 22, 2004

(65) Prior Publication Data
US 2005/0139956 A1    Jun. 30, 2005

(30) Foreign Application Priority Data
Dec. 25, 2003  (JP)  .............................. 2003-429100

(51) Int. Cl.
*H01L 21/20*  (2006.01)
(52) U.S. Cl. ................. 438/393; 257/532; 257/E21.008
(58) Field of Classification Search ................. 438/439; 257/532, E21.008
See application file for complete search history.

(56) References Cited

U.S. PATENT DOCUMENTS

| | | | | |
|---|---|---|---|---|
| 5,405,806 A | * | 4/1995 | Pfiester et al. | .............. 438/630 |
| 6,599,667 B2 | * | 7/2003 | Yusa et al. | ...................... 430/5 |
| 2003/0011043 A1 | * | 1/2003 | Roberts | ...................... 257/532 |
| 2004/0046203 A1 | * | 3/2004 | Morimoto | .................... 257/303 |
| 2004/0169216 A1 | * | 9/2004 | Kiyotoshi | .................... 257/296 |
| 2005/0062130 A1 | * | 3/2005 | Ciancio et al. | .............. 257/532 |

FOREIGN PATENT DOCUMENTS

| | | | |
|---|---|---|---|
| JP | 11-354723 A | | 12/1999 |
| JP | 2001-274340 | * | 10/2001 |
| JP | 2001-274340 A | | 10/2001 |
| JP | 2003-031665 A | | 1/2003 |
| JP | 2003-158190 A | | 5/2003 |
| JP | 158190 A | * | 5/2003 |

\* cited by examiner

*Primary Examiner*—Trung Dang
(74) *Attorney, Agent, or Firm*—Sughrue Mion, PLLC

(57) ABSTRACT

On a silicon substrate, a first insulation layer, a lower conductive layer, a capacitor-insulator layer, and an upper conductive layer are formed in that order. Then, a first resist pattern is formed, the upper conductive layer is etched to form an upper electrode, and the capacitor-insulator layer is successively etched partway under the same etching condition as that of the upper conductive layer. Next, second resist pattern is formed, the remaining part of the capacitor-insulator layer is etched to form a second insulation layer, and the lower conductive layer is successively etched under the same etching condition as that of the capacitor-insulator layer so as to form a lower electrode and a lower wiring. In this manner, an MiM capacitor element constituted by the upper electrode, a part of the second insulation layer, and the lower electrode can be fabricated.

8 Claims, 5 Drawing Sheets

US 7,432,170 B2

SEMICONDUCTOR DEVICE AND FABRICATION METHOD THEREOF

BACKGROUND OF THE INVENTION

1. Field of the Invention

The present invention relates to a semiconductor device including an MiM (Metal Insulator Metal) capacitor element and a fabrication method thereof. The present invention can be applied to fabrication of a capacitor element using photolithography. In particular, the present invention is suitable for fabrication of an MiM capacitor element in a semiconductor device.

2. Description of the Related Art

Conventionally, an MiM capacitor element is used as a capacitor element formed in a semiconductor device. The MiM capacitor element has a lower electrode formed of metal or alloy (hereinafter, collectively referred to as metal), an upper electrode formed of metal, and an insulation layer formed between the lower and upper electrodes. (See Japanese Patent Laid-Open Publication No. 2003-31665, FIGS. 1 to 3, for example.)

A fabrication method of the MiM capacitor element disclosed in Japanese Patent Laid-Open Publication No. 2003-31665 is now described. First, an insulation layer is formed on a semiconductor substrate. On the insulation layer, a lower electrode layer, a dielectric layer, and an upper electrode layer are formed in that order. Then, a first resist pattern is formed, and thereafter the upper electrode layer is etched using the first resist pattern as a mask so as to form an upper electrode pattern. The first resist pattern is then removed and a second resist pattern is formed to cover the upper electrode pattern. Using the second resist pattern as a mask, the dielectric layer is etched to form a dielectric pattern. Then, the second resist pattern is removed and a third resist pattern is formed to cover the upper electrode pattern and the dielectric pattern. Using the third resist pattern as a mask, the lower electrode layer is etched to form a lower electrode pattern. In this manner, the MiM capacitor element is fabricated.

However, in the conventional fabrication method described above, it is necessary to perform photolithography three times in order to form the MiM capacitor element. Thus, three masks are required and the number of the performed processes is large. This means that a fabrication cost is expensive.

Therefore, another fabrication method is proposed in which an MiM capacitor element is fabricated by performing photolithography twice. Such a conventional fabrication method of a semiconductor device including an MiM capacitor element is described below. FIGS. 1 to 4 are cross-sectional views showing processes of the conventional fabrication method of the semiconductor device in an order in which the processes are performed. As shown in FIGS. 1 to 4, in this semiconductor device, an MiM region 11 in which an MiM capacitor element is to be formed and a wiring region 12 in which a wiring is to be formed are provided.

First, as shown in FIG. 1, an insulation layer 2 is formed on a silicon substrate 1. On the insulation layer 2, an Al layer is deposited to form a lower conductive layer 3a. Then, an SiO or SiON layer is deposited by plasma CVD method (Plasma-enhanced Chemical Vapor Deposition method) on the lower conductive layer 3a to form a capacitor-insulator layer 4d. On the capacitor-insulator layer 4d, a TiN layer is deposited, so that an upper conductive layer 5a is formed. Then, a photoresist layer is formed on the upper conductive layer 5a and is patterned to form a resist pattern 6 in the MiM region 11. Using the resist pattern 6 as a mask, the upper conductive layer 5a and the capacitor-insulator layer 4d are etched to be selectively removed, so that an upper electrode 5 of TiN and a capacitor insulation layer 14 of SiO or SiON are obtained. Then, the resist pattern 6 is removed.

Next, as shown in FIG. 2, another photoresist layer is formed on the lower conductive layer 3a (see FIG. 1) to cover the capacitor insulation layer 14 and the upper electrode 5. Then, the photoresist layer is patterned to form a resist pattern 7 in both the MiM region 11 and the wiring region 12. Using the resist pattern 7 as a mask, the lower conductive layer 3a is etched to be selectively removed, so that a lower electrode 3 of Al is formed in the MiM region 11. At the same time, a lower wiring 13 of Al is formed in the wiring region 12. Then, the resist pattern 7 is removed.

Next, as shown in FIG. 3, an insulation layer 8 is formed on the insulation layer 2 to cover the lower electrode 3, the lower wiring 13, the capacitor insulation layer 14, and the upper electrode 5. The surface of the insulation layer 8 is flattened. Then, a plurality of via holes 9 are formed in the insulation layer 8 to connect with the upper electrode 5, the lower electrode 3, and the lower wiring 13, respectively.

Next, as shown in FIG. 4, upper wirings 10 are formed on the insulation layer 8 in regions containing regions directly above the via holes 9. Thus, the upper wirings 10 are connected to the upper electrode 5, the lower electrode 3, and the lower wiring 13 through the via holes 9. In this manner, a semiconductor device which includes the MiM capacitor element formed by the upper electrode 5, the capacitor insulation layer 14 and the lower electrode 3 is fabricated.

In this semiconductor device, the MiM capacitor element works as a capacitor when a voltage is applied between the upper electrode 5, and the lower electrode 3 via the upper wirings 10 and the via holes 9. According to the aforementioned fabrication method, the MiM capacitor element having a three-layer structure can be formed by performing photolithography twice.

However, the conventional fabrication method described above has the following problem. In the process of the above fabrication method, shown in FIG. 1, the upper conductive layer 5a and the capacitor-insulator layer 4d are etched using the resist pattern 6 as a mask. By this etching, the upper conductive layer 5a and the capacitor-insulator layer 4d are completely removed in a region having no resist pattern 6 formed therein, so that the lower conductive layer 3a is exposed to the etching gas. Thus, part of the material (Al) forming the lower conductive layer 3a leaves the lower conductive layer 3a to the atmosphere and adheres to side faces of the upper electrode 5 and capacitor insulation layer 14 as conductive deposit. The conductive deposit may cause a leak current between the upper electrode 5 and the lower electrode 3 in a resultant MiM capacitor element, thus degrading the performance of the MiM capacitor element.

SUMMARY OF THE INVENTION

It is an object of the present invention to provide a semiconductor device including an MiM capacitor element which can be formed by performing photolithography twice and can prevent adhesion of conductive deposit to side faces of the MiM capacitor element, and to provide a fabrication method of that semiconductor device.

A semiconductor device according to the present invention comprises: a lower electrode; a capacitor insulation layer provided on the lower electrode in its all areas; and an upper electrode provided on a part of the capacitor insulation layer. A thickness of the capacitor insulation layer in a region directly below the upper electrode is thicker than that in other regions thereof. The upper electrode, the capacitor insulation layer, and the lower electrode constitute a capacitor element.

According to the present invention, an MiM capacitor element can be constituted by the lower electrode, the upper electrode, and the capacitor insulation layer provided between those electrodes. This MiM capacitor element can be formed by performing photolithography twice. Moreover, no conductive deposit adheres to the side faces of the MiM capacitor element and therefore a leak current caused by the conductive deposit can be prevented.

A fabrication method of a semiconductor device according to the present invention comprises the steps of: forming a first conductive layer on a supporting substrate; forming a capacitor-insulator layer on the first conductive layer; forming a second conductive layer on the capacitor-insulator layer; forming a first resist pattern on the second conductive layer; etching the second conductive layer for selectively removing the second conductive layer by using the first resist pattern as a mask, to obtain an upper electrode formed by the second conductive layer, and etching the capacitor-insulator layer for selectively removing a part of the capacitor-insulator layer in a thickness direction; forming a second resist pattern to cover a region containing a region directly above the upper electrode; and etching the capacitor-insulator layer for selectively removing a remaining part of the capacitor-insulator layer by using the second resist pattern as a mask, to obtain a capacitor insulation layer formed by the capacitor-insulator layer, and etching the first conductive layer for selectively removing the first conductive layer to obtain a lower electrode formed by the first conductive layer.

According to the present invention, a part of the capacitor-insulator layer is etched in the first etching step in which the second conductive layer is etched, and the remaining part of the capacitor-insulator layer is etched in the second etching step in which the first conductive layer is etched. Thus, an MiM capacitor element can be formed by performing photolithography twice. Therefore, a fabrication cost of the semiconductor device is reduced. Moreover, the first conductive layer is not exposed to the outside in the first etching step. Therefore, no conductive deposit adheres to the side faces of the upper electrode. In addition, in the second etching step, no conductive deposit adheres to the side faces of the upper electrode and the side faces of the capacitor-insulator layer because the second resist pattern covers the side faces of the upper electrode and the side faces of the capacitor-insulator layer. Thus, in the MiM capacitor element, a leak current caused by the conductive deposit can be prevented.

In the first etching step, it is preferable to etch the capacitor-insulator layer under a condition that is the same as a condition of etching of the second conductive layer. In addition, in the second etching step, it is preferable to etch the first conductive layer under a condition that is the same as the condition of etching of the capacitor-insulator layer. In this case, etching can be performed successively in each etching step, thus further reducing the fabrication cost of the semiconductor device.

According to the present invention, an MiM capacitor element having a three-layer structure can be formed by performing photolithography twice. Moreover, no conductive deposit adheres to side faces of the MiM capacitor element. Therefore, a semiconductor device in which a leak current caused by the conductive deposit is not generated in the MiM capacitor element can be obtained at a reduced cost.

DETAILED DESCRIPTION OF THE PREFERRED EMBODIMENT

Figure 1:
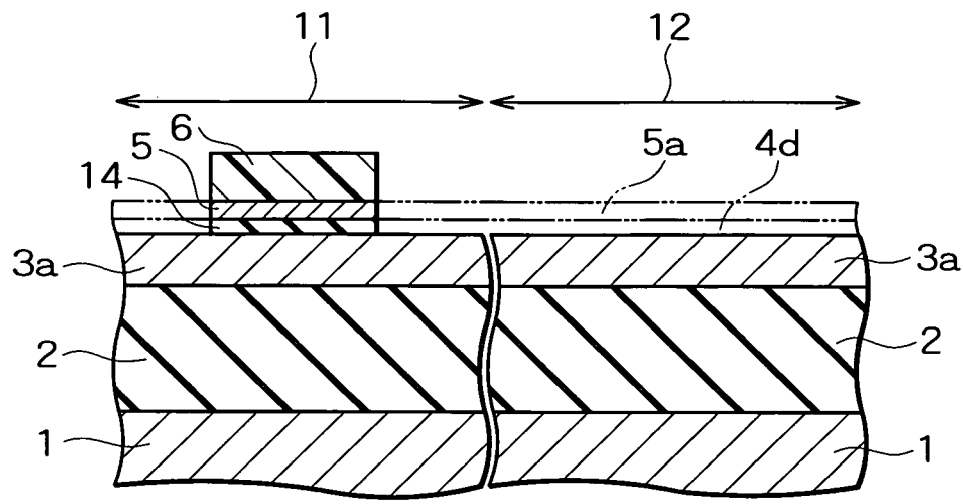
FIG. 1 is a cross-sectional view showing a process of a conventional fabrication method of a semiconductor device.
Figure 2:
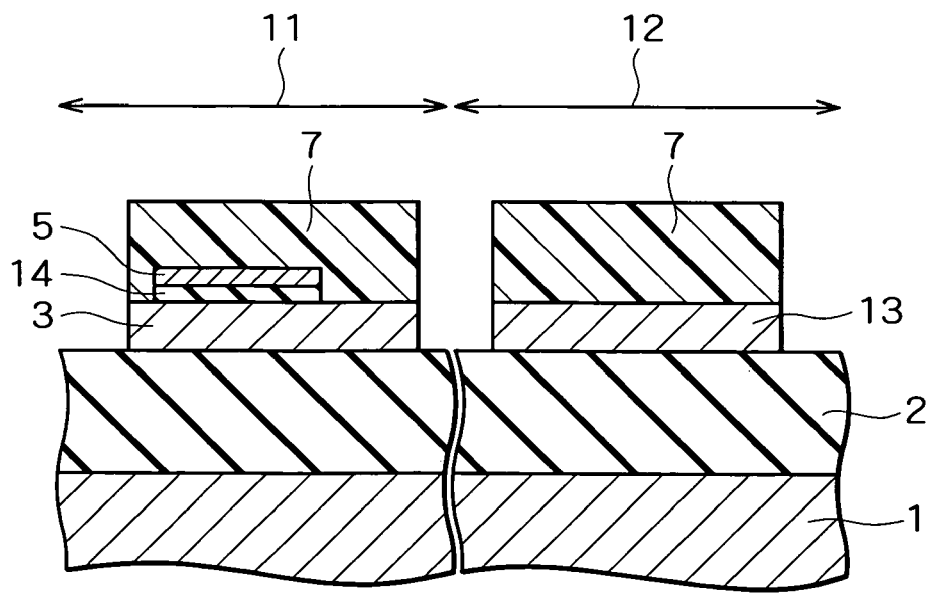
FIG. 2 is a cross-sectional view showing a process of the conventional fabrication method of the semiconductor device, which is performed next to the process of FIG. 1.
Figure 3:
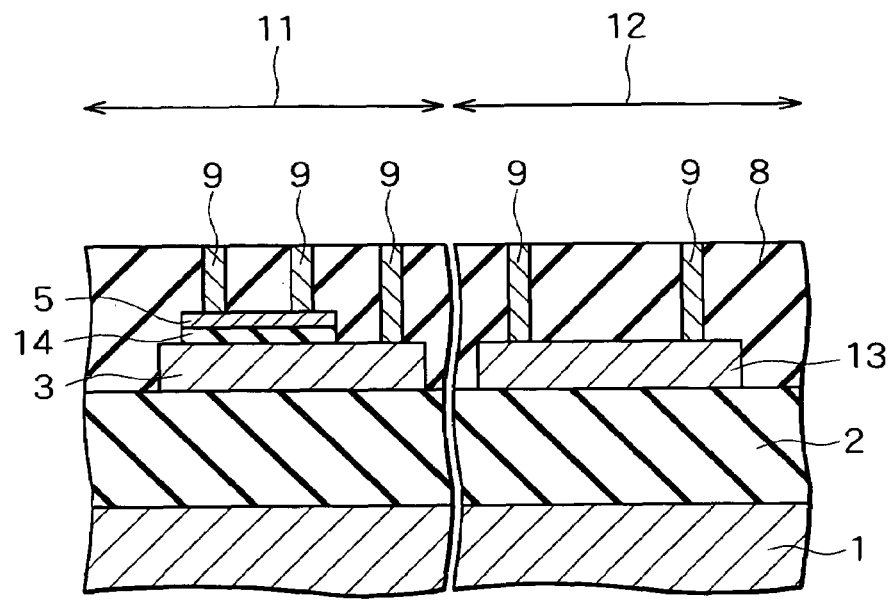
FIG. 3 is a cross-sectional view showing a process of the conventional fabrication method of the semiconductor device, which is performed next to the process of FIG. 2.
Figure 4:
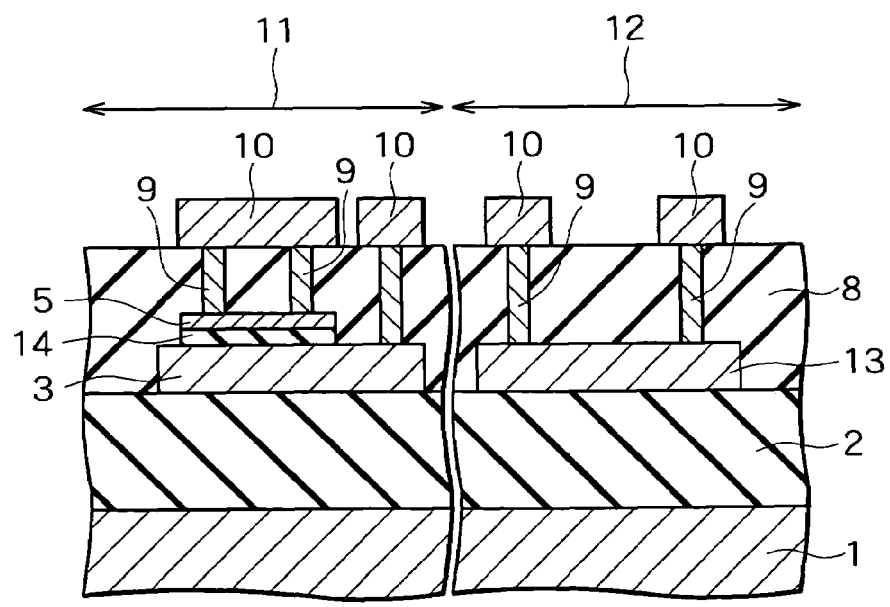
FIG. 4 is a cross-sectional view showing a process of the conventional fabrication method of the semiconductor device, which is performed next to the process of FIG. 3.
Figure 5:
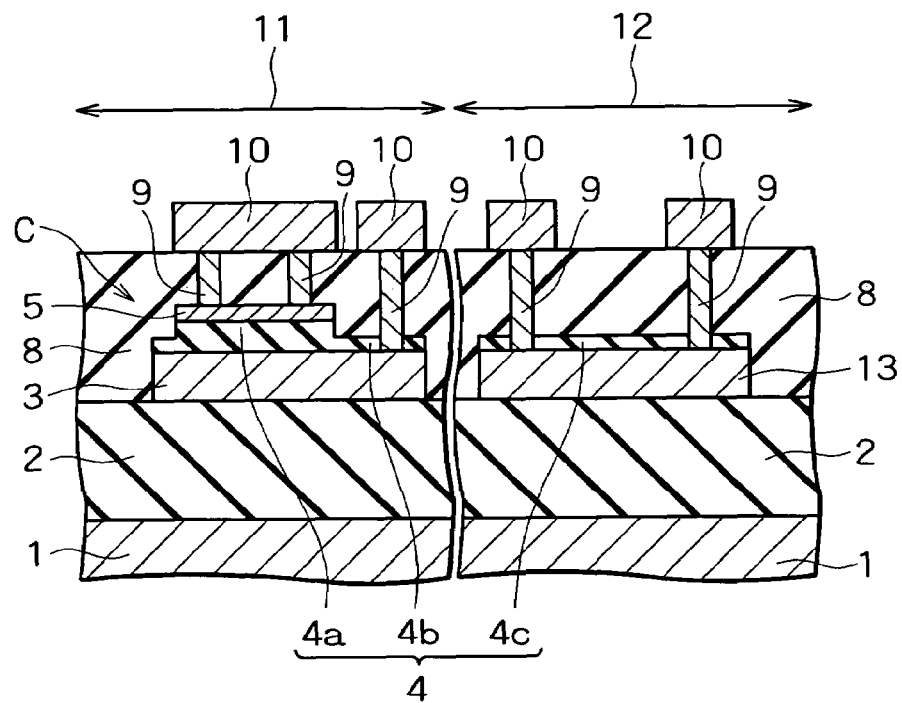
FIG. 5 is a cross-sectional view of a semiconductor device according to an embodiment of the present invention.

A preferred embodiment of the present invention will be now described specifically, referring to attached drawings. FIG. 5 is a cross-sectional view of a semiconductor device according to an embodiment of the present invention. The components of the semiconductor device shown in FIG. 5, which are the same as those of the conventional semiconductor device described above, are labeled with the same reference numerals as those in FIGS. 1 to 4.

As shown in FIG. 5, in the semiconductor device of the present embodiment, an MiM region 11 in which an MiM capacitor element C is formed and a wiring region 12 in which a wiring is formed are provided. Moreover, on a silicon substrate 1 formed of P type silicon, for example, an insulation layer 2 is provided. The insulation layer 2 is formed of silicon oxide, for example, and has a thickness of from 1 to 5 μm, for example.

In the MiM region 11, a lower electrode 3 is provided on the insulation layer 2. In the wiring region 12, a lower wiring 13 is provided on the insulation layer 2. Both the lower electrode 3 and the lower wiring 13 are arranged on the top surface of the insulation layer 2, are formed of Al (aluminum), for example, and have a thickness of 0.6 μm, for example. The lower wiring 13 is formed by patterning a conductive layer with the lower electrode 3. The lower electrode 3 has a rectangular shape having a size of 25 μm×25 μm, seen from a direction perpendicular to the surface of the silicon substrate 1. The shape of the lower electrode 3 is not limited to a rectangular shape, and may be another shape. The lower wiring 13 is a wiring in the first wiring layer of the semiconductor device of the present embodiment, for example, and has a width of 2 μm, for example.

On the lower electrode 3 and the lower wiring 13, an insulation layer 4 is formed in all areas. The insulation layer 4 is formed of SiO (silicon oxide) or SiON (silicon oxynitride) that is deposited by plasma CVD, for example. On the part of the insulation layer 4 in the MiM region 11, an upper electrode 5 is provided. The upper electrode 5 is formed of TiN (titanium nitride), for example, and has a rectangular shape, for example, seen from the direction perpendicular to the surface of the silicon substrate 1. The upper electrode 5 has a size of 20 μm×20 μm, for example, and has a thickness of 0.2 μm, for example.

A portion 4a of the insulation layer 4 located directly below the upper electrode 5 is formed to be thicker than the remaining portion 4b in the MiM region 11 and a portion 4c in the wiring region 12. The thickness of the portion 4a of the insulation layer 4 is 50 nm, for example, while the thickness of the portions 4b and 4c is from 10 to 40 nm, for example. In other words, the insulation layer 4 is formed by an upper part and a lower part. When seen from the direction perpendicular to the surface of the silicon substrate 1, i.e., in a plan view, the upper part exists only in the portion 4a while the lower part exists in all portions of the insulation layer 4. In addition, in the plan view, the upper part has the same shape as that of the upper electrode 5, and the lower part has the same shape as those of the lower electrode 3 and the lower wiring 13. Incidentally, the upper part and the lower part described above are deposited integrally and have no physical boundary face between them. The lower electrode 3, the portion 4a of the insulation layer 4, and the upper electrode 5 constitute an MiM capacitor element C. The portion 4a of the insulation layer 4 serves as a capacitor insulation layer of the MiM capacitor element C.

On the insulation layer 2, an insulation layer 8 is provided to cover the lower electrode 3 and the lower wiring 13, the insulation layer 4, and the upper electrode 5. The insulation layer 8 is formed of silicon oxide, for example, and has a thickness of 0.8 μm, for example. In a part of a region of the insulation layer 8 located directly above the upper electrode 5, the lower electrode 3, and the lower wiring 13, a plurality of via holes 9 are formed. Those via holes 9 are connected to the upper electrode 5, the lower electrode 3, and the lower wiring 13, respectively. On the insulation layer 8, upper wirings 10 are provided in regions containing the regions directly above the via holes 9. The upper wirings 10 are connected to the via holes 9. Thus, the upper wirings 10 are connected to the upper electrode 5, the lower electrode 3, and the lower wiring 13 through the via holes 9, respectively. The upper wirings 10 are formed of Al, for example, and have a thickness of 0.6 μm and a width of 2 μm, for example. The upper wirings 10 are wirings in the second wiring layer of the semiconductor device of the present embodiment, for example.

In the semiconductor device having the above structure, when potentials are respectively applied to the upper electrode 5 and the lower electrode 3 through the upper wirings 10 and the via holes 9, the MiM capacitor element C stores electric charges in accordance with a difference between the potentials. In addition, the upper wirings 10 that are different from each other are connected to each other by the via holes 9 and the lower wiring 13, so that a current flows through the upper wirings 10.

Next, a fabrication method of a semiconductor device according to the present embodiment is described. FIGS. 6 to 10 are cross-sectional views showing processes of the fabrication method of the semiconductor device of the present embodiment in an order in which the processes are performed.

Figure 6:
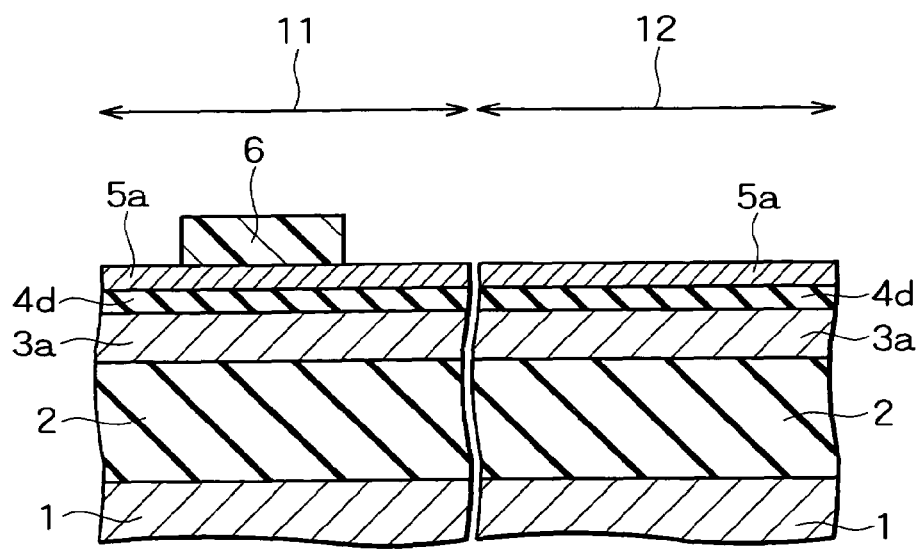
FIG. 6 is a cross-sectional view showing a process of a fabrication method of a semiconductor device according to the embodiment of the present invention.

First, as shown in FIG. 6, a silicon substrate 1 formed of P type silicon, for example, is prepared. Then, a silicon oxide layer is deposited on the silicon substrate 1 by plasma CVD, for example, to have a thickness of from 1 to 5 μm, thereby forming an insulation layer 2 on the silicon substrate 1. On the insulation layer 2, an Al layer is deposited to have a thickness of 0.6 μm, for example, to form a lower conductive layer 3a. On the lower conductive layer 3a, a SiO or SiON layer is deposited to have a thickness of 50 nm, for example, by plasma CVD to form a capacitor-insulator layer 4d. On the capacitor-insulator layer 4d, TiN is deposited by sputtering to have a thickness of 0.2 μm, for example, thereby forming an upper conductive layer 5a. On the upper conductive layer 5a, a photoresist layer is formed. Then, the photoresist layer is patterned to form a resist pattern 6 in the MiM region 11 in such a manner that the resist pattern 6 covers a region in which an upper electrode 5 (see FIG. 5) is to be formed in the following process.

Figure 7:
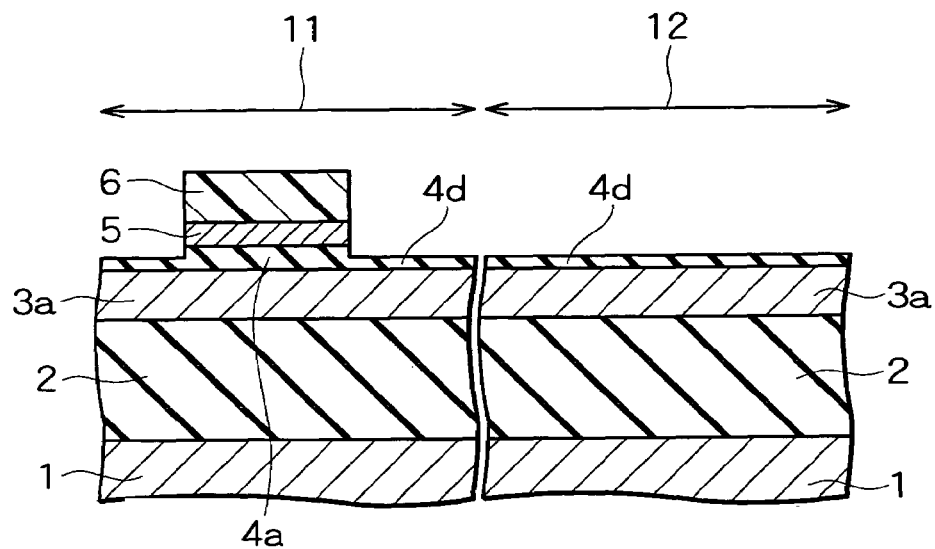
FIG. 7 is a cross-sectional view showing a process of the fabrication method of the semiconductor device according to the embodiment of the present invention, which is performed next to the process of FIG. 6.

Next, as shown in FIG. 7, the upper conductive layer 5a (see FIG. 6) is selectively removed by plasma etching using the resist pattern 6 as a mask and a chlorine-containing gas. As a result, the upper conductive layer 5a is completely removed in a region having no resist pattern 6, whereas the upper electrode 5 of TiN is formed in the region having the resist pattern 6 formed therein. Then, by successively performing etching under a condition that is the same as the condition of etching of the upper conductive layer 5a, the capacitor-insulator layer 4d is etched, so that a part thereof is removed in a thickness direction. The aforementioned chlorine-containing gas is usually used for etching of metal or alloy. However, the chlorine-containing gas can etch SiO and SiON layers to a certain degree. Therefore, in the region having no resist pattern 6, only a part of the capacitor-insulator layer 4d is removed in the thickness direction, and the remaining part is left. Thus, the part of the capacitor-insulator layer 4d that is covered by the resist pattern 6, i.e., the portion 4a directly below the upper electrode 5 keeps the same thickness as that before etching. Therefore, the thickness of the portion 4a is about 50 nm, for example. On the other hand, the part of the capacitor-insulator layer 4d that is not covered by the resist pattern 6 becomes thinner by etching, and the thickness of that part is from 10 to 40 nm, for example. Then, the resist pattern 6 is removed.

Figure 8:
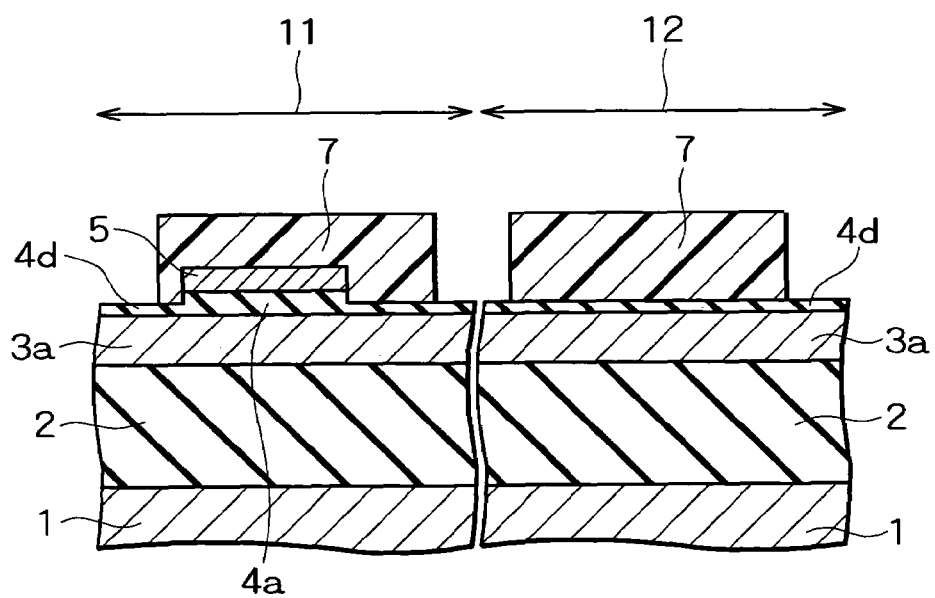
FIG. 8 is a cross-sectional view showing a process of the fabrication method of the semiconductor device according to the embodiment of the present invention, which is performed next to the process of FIG. 7.

Next, as shown in FIG. 8, a photoresist layer is formed on the capacitor-insulator layer 4d to cover the upper electrode 5. The photoresist layer is then patterned to form a resist pattern 7 in both the MiM region 11 and the wiring region 12 in such a manner that the resist pattern 7 covers a region in which a lower electrode 3 and a lower wiring 13 (see FIG. 5) are to be formed in the following process. The resist pattern 7 is formed to cover a region containing a region directly above the upper electrode 5, i.e., to cover the upper surface and the side faces of the upper electrode 5 and the side faces of the portion 4a of the insulation layer 4.

Figure 9:
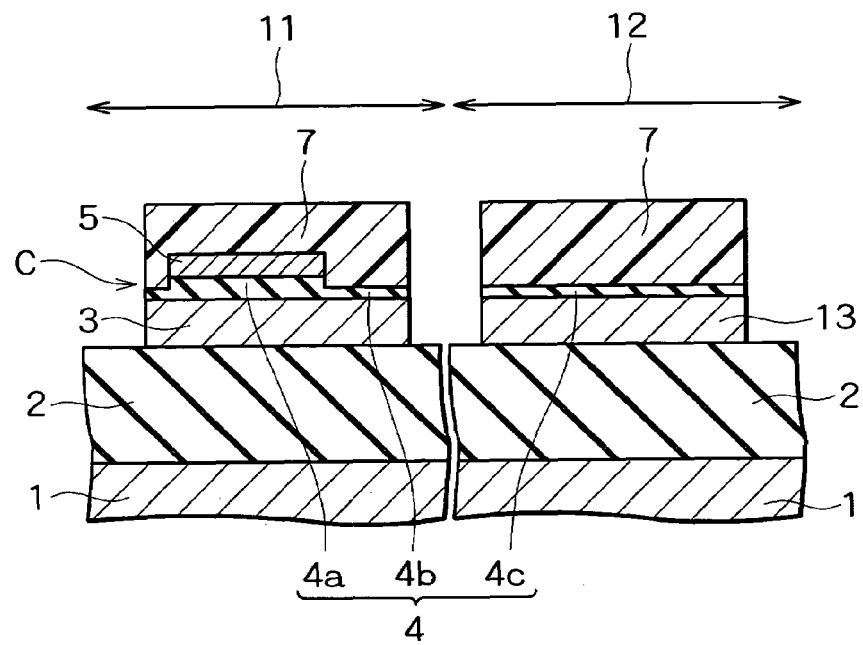
FIG. 9 is a cross-sectional view showing a process of the fabrication method of the semiconductor device according to the embodiment of the present invention, which is performed next to the process of FIG. 8.

Next, as shown in FIG. 9, the remaining part of the capacitor-insulator layer 4d (see FIG. 8) is selectively removed by plasma etching using the resist pattern 7 as a mask and a chlorine-containing gas to form an insulation layer 4. As described before, although the chlorine-containing gas is usually used for etching metal or alloy, it can etch SiO, SiON and the like layers at a low etching rate. In the present embodiment, the part of the capacitor-insulator layer 4d that is not covered by the resist pattern 7 was etched in the thickness direction to be made thinner in the process of FIG. 7. Therefore, the capacitor-insulator layer 4d can be selectively removed by plasma etching using the chlorine-containing gas. Then, by successively performing etching under the same etching condition, the lower conductive layer 3a (see FIG. 8) is etched and selectively removed, so that the lower electrode 3 of Al is formed in the MiM region 11 and the lower wiring 13 of Al is formed in the wiring region 12. In this manner, an MiM capacitor element C formed by the upper electrode 5, the portion 4a of the insulation layer 4, and the lower electrode 3 is fabricated. Moreover, the insulation layer 4 is formed on the lower electrode 3 and the lower wiring 13 in their all areas. Then, the resist pattern 7 is removed.

Figure 10:
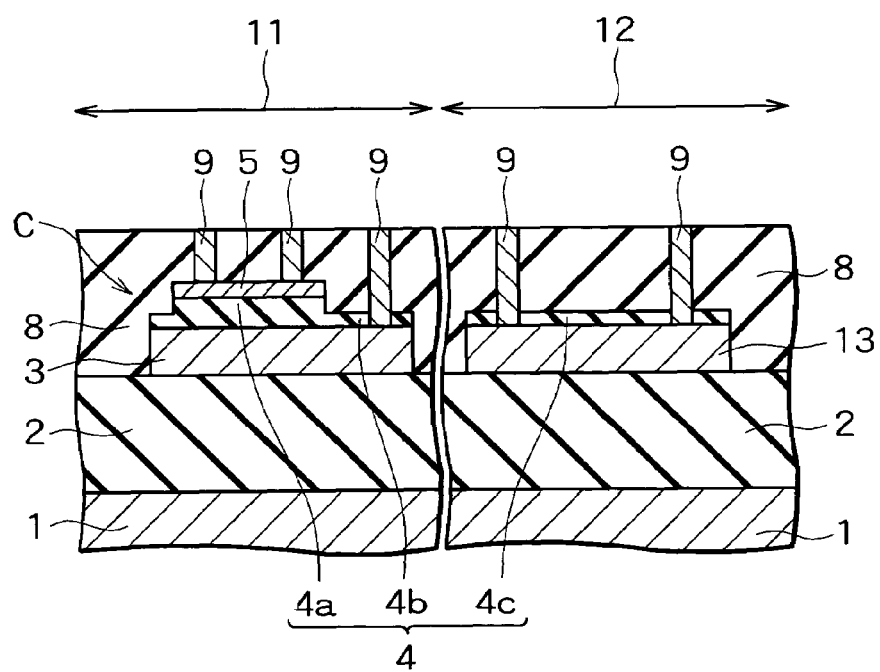
FIG. 10 is a cross-sectional view showing a process of the fabrication method of the semiconductor device according to the embodiment of the present invention, which is performed next to the process of FIG. 9.

Next, as shown in FIG. 10, an insulation layer 8 is formed on the insulation layer 2 to cover the lower electrode 3, the lower wiring 13, the insulation layer 4 and the upper electrode 5. The insulation layer 8 is formed by depositing a silicon oxide layer by plasma CVD, for example, to have a thickness of 0.8 μm. The surface of the insulation layer 8 is flattened. Then, a plurality of via holes 9 are formed in the insulation layer 8 to connect with the upper electrode 5, the lower electrode 3, and the lower wiring 13, respectively.

Next, as shown in FIG. 5, upper wirings 10 are formed on the insulation layer 8 in regions containing regions directly above the via holes 9. As a result, the upper wirings 10 are connected to the upper electrode 5, the lower electrode 3, and the lower wiring 13 through the via holes 9, respectively. In this manner, a semiconductor device including the MiM capacitor element C is fabricated.

In the present embodiment, the first etching using the resist pattern 6 as a mask (see FIG. 7) removes the upper conductive layer 5a entirely and also removes a part of the capacitor-insulator layer 4d in its thickness direction, while the second etching using the resist pattern 7 as a mask (see FIG. 9) removes the remaining part of the capacitor-insulator layer 4d and the whole of the lower conductive layer 3a. Thus, an MiM capacitor element having a three-layer structure can be formed by performing photolithography twice.

Moreover, since a part of the capacitor-insulator layer 4d is left in the first etching, the lower conductive layer 3a is not exposed to etching gas in the first etching. Thus, no conductive deposit is formed. In addition, since the side faces of the upper electrode 5 and the side faces of the portion 4a of the insulation layer 4 which serves as a capacitor insulation layer are covered with the resist pattern 7 in the second etching, no conductive deposit caused by the lower conductive layer 3a adheres to those side faces. Therefore, no conductive deposit adheres to the MiM capacitance element C and no leak current caused by the conductive deposit occurs.

Furthermore, in the first etching, the condition of etching of the capacitor-insulator layer 4d is set to be the same as the condition of etching of the upper conductive layer 5a. In addition, in the second etching, the condition of etching of the lower conductive layer 3a is set to be the same as the condition of etching of the capacitor-insulator layer 4d. Thus, the upper conductive layer 5a and the capacitor-insulator layer 4d can be etched successively in the first etching, and the capacitor-insulator layer 4d and the lower conductive layer 3a can be successively etched in the second etching. As a result, the etching process can be simplified, thus further reducing the fabrication cost of the semiconductor device.

In addition, since the capacitor-insulator layer 4d is etched partway in the first etching, the thickness of the capacitor-insulator layer 4d, that is to be etched in the second etching, can be reduced. Thus, it is possible to etch the lower electrode 3 and the lower wiring 13, and the capacitor-insulator layer 4d under the same etching condition in the second etching.

In the present embodiment, the lower electrode 3 and the lower wiring 13 are formed of Al. However, the present invention is not limited thereto. For example, the lower electrode 3 and the lower wiring 13 may be formed of AlCu alloy, for example, or may have a two-layer structure in which a TiN layer is formed on an AlCu alloy layer.

What is claimed is:

1. A semiconductor device comprising:
   lower electrode;
   capacitor insulation layer provided on an entire upper surface of said lower electrode; and
   an upper electrode provided on a first portion of said capacitor insulation layer, a thickness of said capacitor insulation layer in the first portion below said upper electrode being thicker than that in a second portion of said capacitor insulation layer, wherein said upper electrode, said capacitor insulation layer, and said lower electrode constitute a capacitor element in an area of the first portion of said capacitor insulation layer,
   wherein said capacitor insulation layer is a homogenous material,
   wherein a thickness of the second portion of said capacitor insulation layer is 10 to 40 nanometers,
   wherein the lower layer wiring is formed in the same layer as the capacitor lower electrode.

2. The semiconductor device according to claim 1, further comprising a lower wiring formed by patterning a conductive layer with said lower electrode, said capacitor insulation layer being also provided on an entire upper surface of said lower wiring, and the thickness of said capacitor insulation layer in a region directly above said lower wiring being thinner than in the first portion of said capacitor insulation layer directly below said upper electrode.

3. The semiconductor device according to claim 1, further comprising: a semiconductor substrate; and an insulation layer provided on said semiconductor substrate, said lower electrode being provided on said insulation layer.

4. A method for fabricating a semiconductor device, the method comprising:
   forming a first conductive layer on a supporting substrate;
   forming a capacitor-insulator layer as a homogenous material on said first conductive layer;
   forming a second conductive layer on said capacitor-insulator layer;
   forming a first resist pattern on said second conductive layer;
   etching said second conductive layer for selectively removing said second conductive layer by using said first resist pattern as a mask, to obtain an upper electrode formed by said second conductive layer, and etching said capacitor-insulator layer for selectively removing a portion of said capacitor-insulator layer not disposed below said second conductive layer in a thickness direction;
   forming a second resist pattern to cover a region containing a region directly above said upper electrode; and
   etching said capacitor-insulator layer for selectively removing a remaining part of said capacitor-insulator layer by using said second resist pattern as a mask, to obtain a capacitor insulation layer formed by said capacitor-insulator layer, and etching said first conductive layer for selectively removing said first conductive layer to obtain a lower electrode and a lower layer wiring formed by said first conductive layer,
   wherein said etching of said capacitor-insulation layer using said first resist pattern is performed using a chlorine containing gas such that a thickness of said capacitor insulation layer ranges from 10 to 40 nanometers, wherein said etching of said capacitor-insulation layer using said second resist pattern is performed using a chlorine-containing gas.

5. The method for fabricating a semiconductor device according to claim 4, wherein the etching of said second conductive layer and the etching of said capacitor-insulator layer for selectively removing a part of said capacitor-insulating layer in the thickness direction are performed under a same condition.

6. The method for fabricating a semiconductor device according to claim 4, wherein the etching of said capacitor-insulator layer and the etching of said first conductive layer are performed under a same condition.

7. The method for fabricating a semiconductor device according to claim 4, further comprising depositing an insulation layer on a semiconductor substrate to form said supporting substrate.

8. A method for fabricating a semiconductor device, the method comprising:
   providing a first conductive layer on a supporting substrate, a capacitor-insulator layer as a homogenous material on said first conductive layer, and a second conductive layer on said capacitor-insulator layer;
   forming a first resist pattern on said second conductive layer;
   etching said second conductive layer for selectively removing said second conductive layer by using said first resist pattern as a mask, to obtain an upper electrode formed by said second conductive layer, and etching said capacitor-insulator layer for selectively removing a portion of said capacitor-insulator layer not disposed below said second conductive layer in a thickness direction;
   forming a second resist pattern to cover a region containing a region directly above said upper electrode; and
   etching said capacitor-insulator layer for selectively removing a remaining part of said capacitor-insulator layer by using said second resist pattern as a mask, to obtain a capacitor insulation layer formed by said capacitor-insulator layer, and etching said first conductive layer for selectively removing said first conductive layer to obtain a lower electrode and a lower layer wiring formed by said first conductive layer,
   wherein said etching of said capacitor-insulation layer using said first resist pattern is performed using a chlorine containing gas such that a thickness of said capacitor insulation layer is 10 to 40 nanometers,
   wherein said etching of said capacitor-insulation layer using said second resist pattern is performed using a chlorine-containing gas.

* * * * *